(12) United States Patent
Lin et al.

(10) Patent No.: US 7,646,207 B2
(45) Date of Patent: Jan. 12, 2010

(54) METHOD FOR MEASURING A PROPERTY OF INTERCONNECTIONS AND STRUCTURE FOR THE SAME

(75) Inventors: Jian-Hong Lin, Yunlin (TW); Chin Chuan Peng, Jhudong Township (TW); Shou-Chung Lee, Hsinchu (TW); Chien-Jung Wang, Hsin-Chu (TW); Chien Shih Tsai, Baoshan Township (TW); Bi-Ling Lin, Hsinchu (TW); Yi-Lung Cheng, Danshuei Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 231 days.

(21) Appl. No.: 11/849,836

(22) Filed: Sep. 4, 2007

(65) Prior Publication Data

US 2009/0058434 A1 Mar. 5, 2009

(51) Int. Cl.
*G01R 27/08* (2006.01)

(52) U.S. Cl. .................. 324/719; 324/761; 324/763

(58) Field of Classification Search ........... 324/691, 324/719, 761, 765, 158.1; 438/14, 17
See application file for complete search history.

(56) References Cited

U.S. PATENT DOCUMENTS

| | | | |
|---|---|---|---|
| 6,001,663 A * | 12/1999 | Ling et al. | 438/17 |
| 6,693,446 B2 * | 2/2004 | Song et al. | 324/719 |
| 2003/0189436 A1 * | 10/2003 | Lindolf et al. | 324/715 |
| 2007/0145364 A1 * | 6/2007 | Park | 257/48 |
| 2007/0296439 A1 * | 12/2007 | Feustel et al. | 324/763 |
| 2008/0084223 A1 * | 4/2008 | Lee et al. | 324/751 |

* cited by examiner

*Primary Examiner*—Vincent Q Nguyen
(74) *Attorney, Agent, or Firm*—Thomas, Kayden, Horstemeyer & Risley (57) ABSTRACT

A method for measuring a property of interconnections is provided. The method includes the following steps. A plurality of interconnection test patterns are provided. A pad to which the plurality of interconnection test patterns are parallelly connected is formed. At least one resistor is formed between at least one of the plurality of interconnection test patterns and the pad. The property of the plurality of interconnection test patterns is measured by applying a current, a voltage and/or a mechanical stress to the pad.

20 Claims, 12 Drawing Sheets

FIG. 5b

METHOD FOR MEASURING A PROPERTY OF INTERCONNECTIONS AND STRUCTURE FOR THE SAME

TECHNICAL FIELD

The present invention relates to a method for measuring a property of interconnections and a structure for the same, and more particularly to a more accurate method for measuring a property of interconnections and a structure for the same with the electrostatic discharge (ESD) protection.

BACKGROUND OF THE INVENTION

Integrated circuits are typically fabricated with multiple levels of patterned metallization electrically separated by interlayer dielectrics that contain vias at selected locations to provide electrical connections between the patterned metallization layers. The patterned metallization layers constitute interconnections between elements of the integrated circuits. As integrated circuits are scaled to smaller dimensions in a continual effort to provide increased performance (e.g. increased device speed and more functions within a given area), the interconnection linewidth becomes even narrower, which renders them more susceptible to deleterious effects such as electromigration and stress migration.

The electromigration refers to mass transport of the materials, which comprise the interconnections in response to electrical current conduction. The stress migration refers to mass transport of the interconnection material in response to mechanical stress gradients present in the interconnections which result from thermal expansion coefficient mismatches and compliance mismatches between the conductive runners and surrounding (e.g. overlying and/or underlying) dielectric materials.

Essential to improving the electromigration, stress migration and other properties of the interconnections, is a method for measuring these effects. The typical interconnection test structure is one test line with, for example, 30 samples. Then each sample represents 3.3% cumulative failure rate. However, the quality, such as lifetime, of the interconnections may be predicted based on 0.1% failure rate, and therefore the prediction is performed by extrapolation. However, it has been found not accurate enough as compared to the real situation.

Besides, as the interconnection linewidth shrinks, the width difference between the interconnection test pattern and the line connecting it to the pad for applying a current, a voltage and/or a mechanical stress would be even more distinct. Consequently, a current induced by the electrostatic discharge (ESD) may lead to the burn out of the interconnection test pattern.

Therefore, a more accurate method for measuring a property of interconnections and a structure for the same with the electrostatic discharge (ESD) protection are needed.

SUMMARY OF THE INVENTION

An object of the present invention is to provide a more accurate method for measuring a property of interconnections and a structure for the same with the electrostatic discharge (ESD) protection.

One aspect of the invention provides a method for measuring a property of interconnections. The method includes the following steps. A plurality of interconnection test patterns are provided. A pad to which the plurality of interconnection test patterns are parallelly connected is formed. At least one resistor is formed between at least one of the plurality of interconnection test patterns and the pad. The property of the plurality of interconnection test patterns is measured by applying a current, a voltage and/or a mechanical stress to the pad.

The step of providing a plurality of interconnection test patterns mentioned above may include providing a first metal line of a first width. The plurality of interconnection test patterns may be connected to the pad through a second metal line of a second width, and the second width is at least three times larger than the first width.

The step of forming at least one resistor mentioned above may include forming at least one resistor between the first metal line and the second metal line. The step of forming at least one resistor may include forming at least one resistor between the second metal line and the pad.

The step of forming at least one resistor mentioned above may include the following steps. A resistive area is formed. A first contact connecting the at least one of the plurality of interconnection test patterns to the resistive area is formed. A second contact connecting the pad to the resistive area is formed. The step of forming a resistive area may include forming a polysilicon-based area.

The step of forming at least one resistor mentioned above may include forming a winding metal line connected to the at least one of the plurality of interconnection test patterns at one end and connected to the pad at the other end. The step of forming at least one resistor may include forming at least one resistor of a resistance between 100~5000 Ω.

The step of measuring the property mentioned above may include measuring the electromigration, the stress migration, or a combination thereof. The step of measuring the property may include detecting a resistance variation of the plurality of interconnection test patterns.

Another aspect of the present invention provides an interconnection test structure for measuring a property of interconnections. The interconnection test structure includes a plurality of interconnection test patterns, a pad and at least one resistor between at least one of the plurality of interconnection test patterns and the pad. The plurality of interconnection test patterns are parallelly connected to the pad. The property of the plurality of interconnection test patterns is measured by applying a current, a voltage and/or a mechanical stress to the pad.

The plurality of interconnection test patterns mentioned above may include a first metal line of a first width. The plurality of interconnection test patterns may be connected to the pad through a second metal line of a second width, and the second width is at least three times larger than the first width.

The at least one resistor mentioned above may be located between the first metal line and the second metal line. The at least one resistor may be located between the second metal line and the pad.

The at least one resistor mentioned above may include a resistive area, a first contact and a second contact. The first contact connects the at least one of the plurality of interconnection test patterns to the resistive area. The second contact connects the pad to the resistive area. The resistive area may include a polysilicon-based material.

The at least one resistor mentioned above may include a winding metal line connected to the at least one of the plurality of interconnection test patterns at one end and connected to the pad at the other end. The at least one resistor may have a resistance between 100~5000 Ω.

The property of the plurality of interconnection test patterns mentioned above may include the electromigration, the stress migration, or a combination thereof. The property may be measured further by detecting a resistance variation of the plurality of interconnection test patterns.

BRIEF DESCRIPTION OF THE DRAWINGS

The invention will now be further described by way of example only with reference to the accompany drawings in which.

DETAILED DESCRIPTION OF THE PREFERRED EMBODIMENTS

Figure 1A:
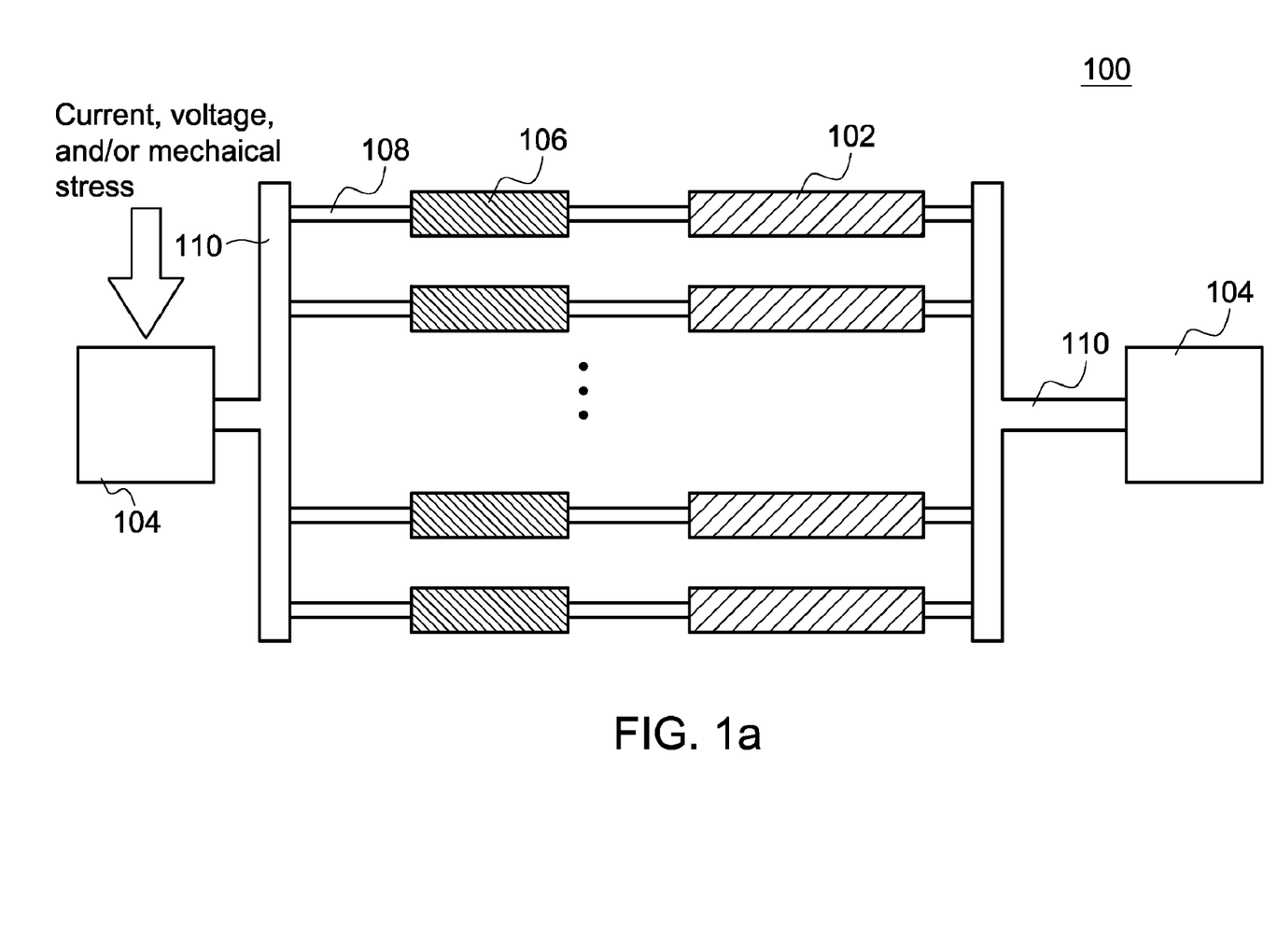
FIG. 1a illustrates a first embodiment of the interconnection test structure according to the present invention.

Referring to FIG. 1a, a first embodiment of the interconnection test structure 100 according to the present invention is illustrated. To form the interconnection test structure 100 for measuring a property of interconnections, a plurality of interconnection test patterns 102 are provided. A pad 104 is formed. And at least one resistor 106 is formed between at least one of the plurality of interconnection test patterns 102 and the pad 104. The plurality of interconnection test patterns 102 are parallelly connected to the pad 104. The property of the plurality of interconnection test patterns 102 is measured by applying a current, a voltage and/or a mechanical stress to the pad 104.

Assume that each interconnection test pattern 102 has 30 samples and since a plurality of, for example, 35, interconnection test patterns 102 are parallelly connected to the pad 104, each sample may represent a cumulative failure rate lower than 0.1%. Thus a real and more accurate measurement may be obtained. Additionally, the resistor 106 between the interconnection test patterns 102 and the pad 104 may prevent the current caused by the electrostatic discharge from burning the interconnection test pattern 102 out. The property of the plurality of interconnection test patterns 102 may include the electromigration, the stress migration, or a combination thereof. The property may be measured further by detecting a resistance variation of the plurality of interconnection test patterns 102. The resistor 106 may have a resistance between 100~5000 Ω. Although the resistors 106 are shown between only one pad 104 and the interconnection test patterns 102 in FIG. 1a, they may also be present between the other pad 104 and the interconnection test patterns 102.

In this embodiment, the plurality of interconnection test patterns 102 includes a first metal line 108 of a first width. The plurality of interconnection test patterns 102 may be connected to the pad 104 through a second metal line 110 of a second width, and the second width is at least three times larger than the first width. The first metal line 108 and the second metal line 110 may be made of a material selected from the group consisting of tungsten, aluminum, copper, and a combination thereof.

Figure 1B:
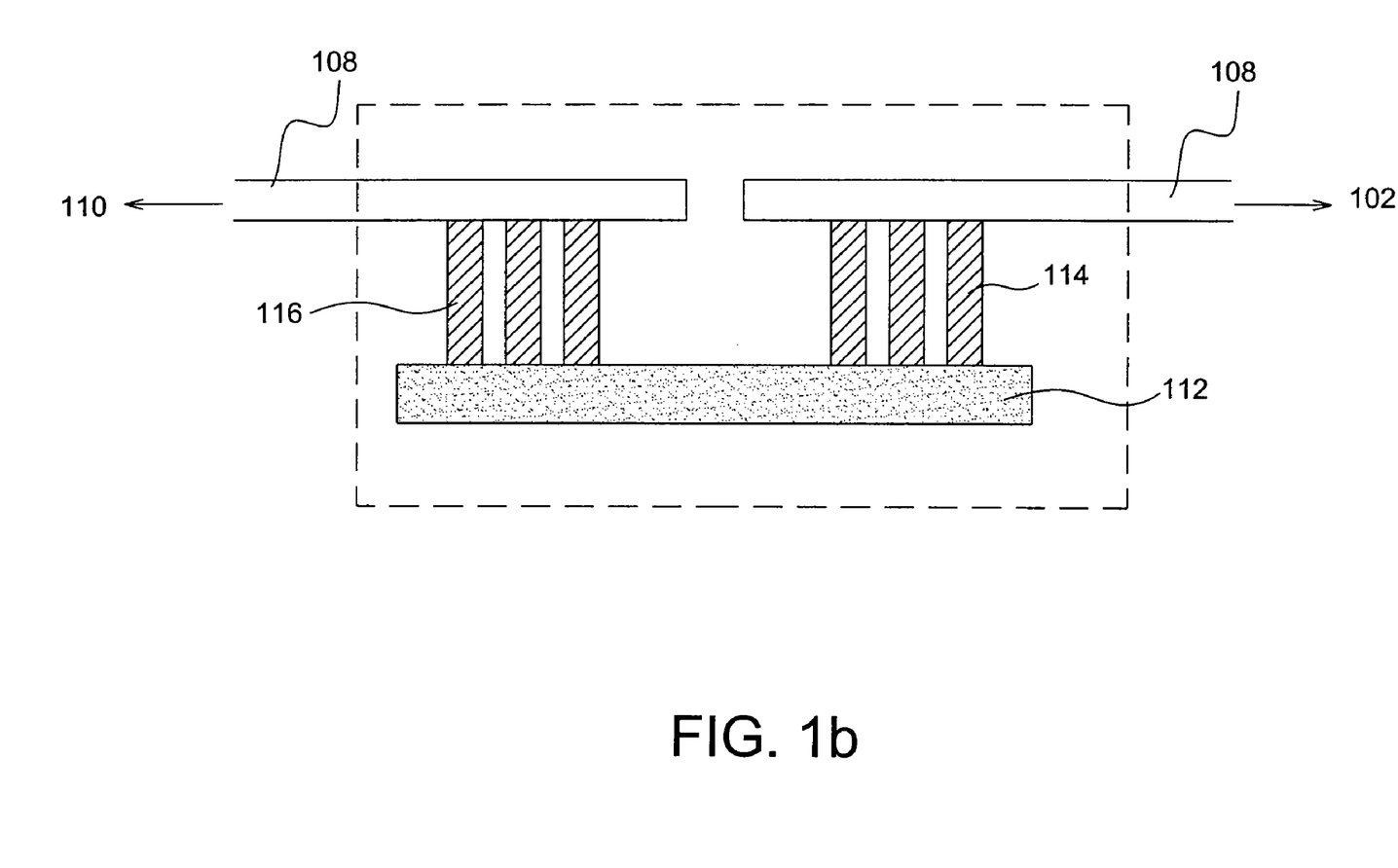
FIG. 1b is a cross-sectional view of one exemplary structure of the resistor in the first embodiment.

In this embodiment, the at least one resistor 106 is located among the first metal line 108. One exemplary structure of the resistor 106 in the first embodiment is shown in FIG. 1b. The resistor 106 may include a resistive area 112, a first contact 114 and a second contact 116. The first contact 114 connects the at least one of the plurality of interconnection test patterns 102 to the resistive area 112. The second contact 116 connects the pad 104 to the resistive area 112 through the first metal line 108 and the second metal line 110. The resistive area 112 may include a polysilicon-based material, such as polysilicon or doped polysilicon, or RPO (resist protective oxide). The first and second contacts 114 and 116 may be made of a material selected from the group consisting of tungsten, aluminum, copper, and a combination thereof.

Figure 1C:
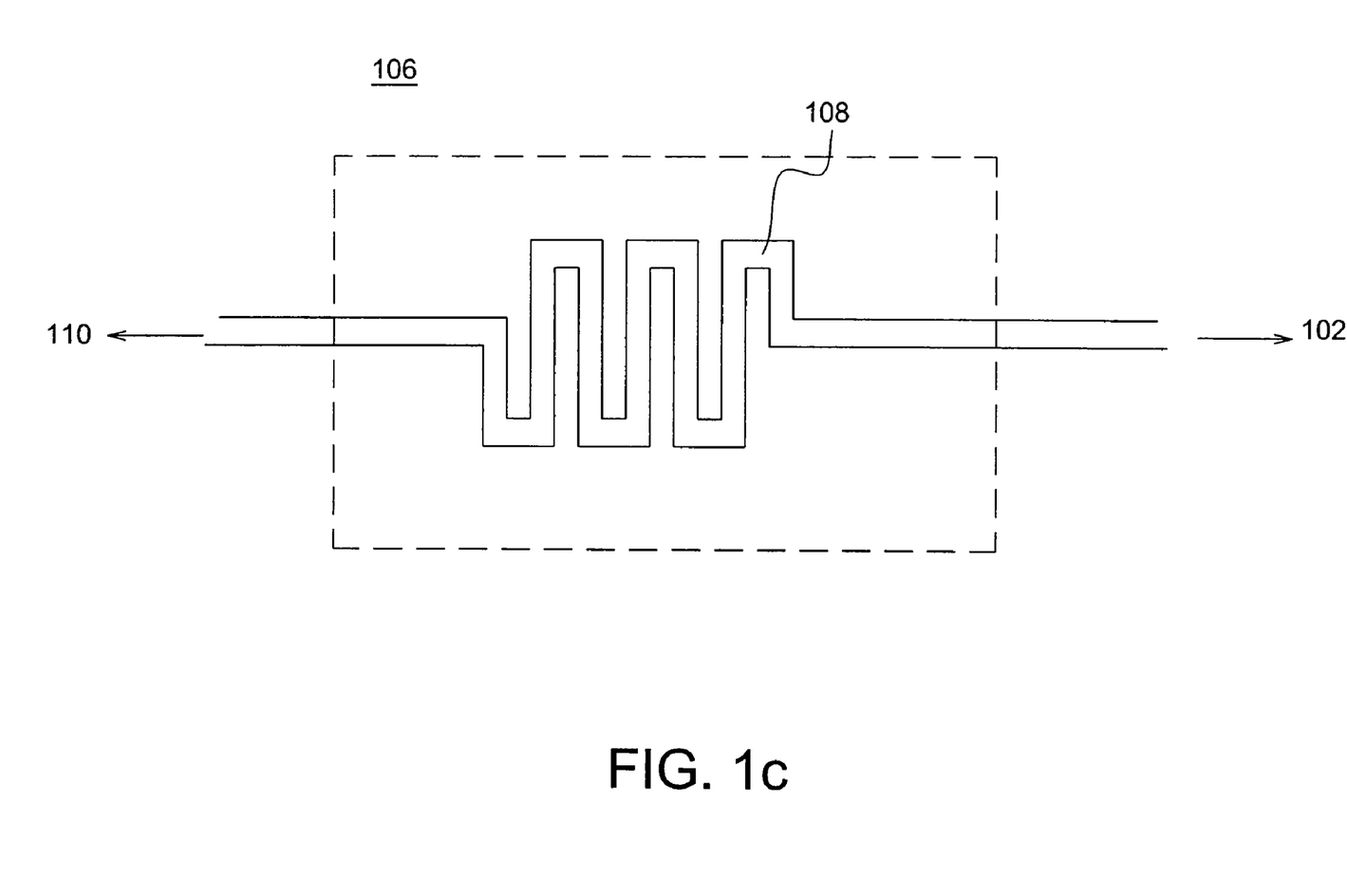
FIG. 1c is a top view of another exemplary structure of the resistor in the first embodiment.

FIG. 1c is a top view of another exemplary structure of the resistor 106 in the first embodiment. The resistor 106 may be formed by winding the first metal line 108, which is connected to at least one of the plurality of interconnection test patterns 102 at one end and to the pad 104 through the second metal line 110 at the other end.

Figure 2A:
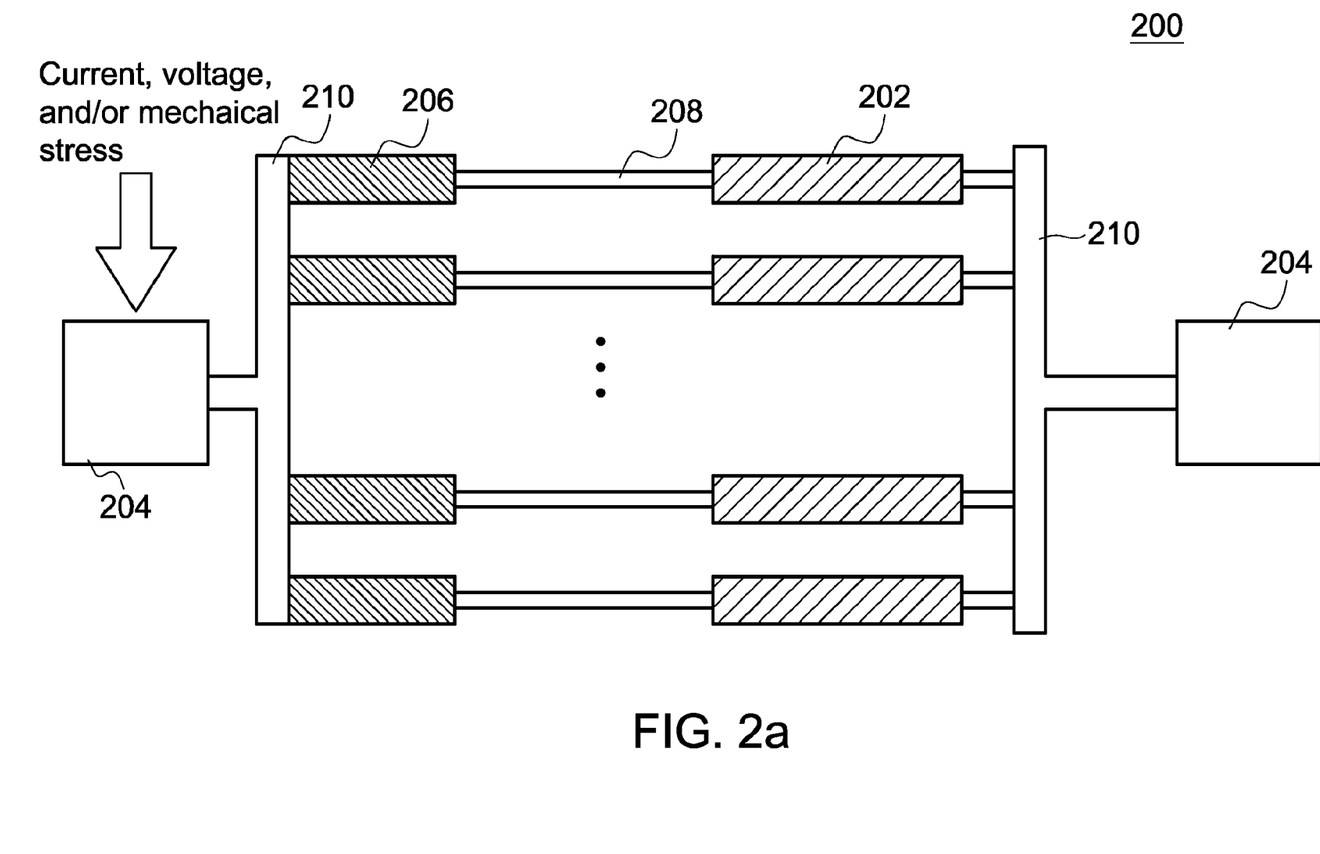
FIG. 2a illustrates a second embodiment of the interconnection test structure according to the present invention.

Referring to FIG. 2a, a second embodiment of the interconnection test structure 200 according to the present invention is illustrated. The interconnection test structure 200 includes a plurality of interconnection test patterns 202, a pad 204 and at least one resistor 206 between at least one of the plurality of interconnection test patterns 202 and the pad 204. The plurality of interconnection test patterns 202 are parallelly connected to the pad 204. The property of the plurality of interconnection test patterns 202 is measured by applying a current, a voltage and/or a mechanical stress to the pad 204.

The interconnection test structure 200 is similar to the interconnection test structure 100 shown in FIG. 1a, except that the resistor 206 is located between the first metal line 208 of a first width and the second metal line 210 of a second width. The second width is still at least three times larger than the first width. Although the resistors 206 are shown between only one pad 204 and the interconnection test patterns 202 in FIG. 2a, they may also present between the other pad 204 and the interconnection test patterns 202. The first metal line 208 and the second metal line 210 may be made of a material selected from the group consisting of tungsten, aluminum, copper, and a combination thereof.

Figure 2B:
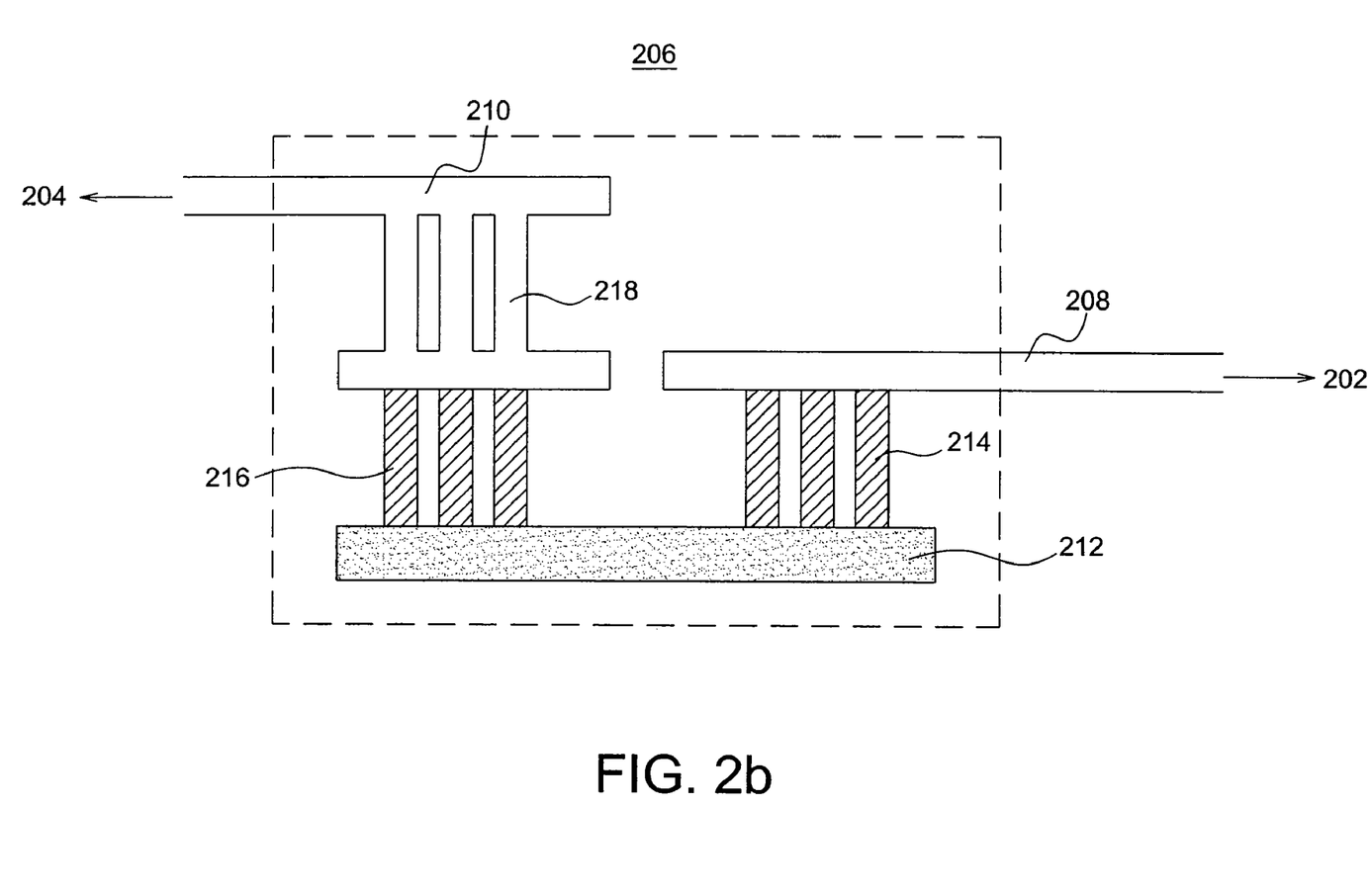
FIG. 2b is a cross-sectional view of one exemplary structure of the resistor in the second embodiment.

One exemplary structure of the resistor 206 in the second embodiment is shown in FIG. 2b. The resistor 206 may include a resistive area 212, a first contact 214 and a second contact 216. The first contact 214 connects the at least one of the plurality of interconnection test patterns 202 to the resistive area 212 through the first metal line 208. The second contact 216 connects the pad 204 to the resistive area 212 through the via 218 and the second metal line 210. The resistive area 212 may include a polysilicon-based material, such as polysilicon or doped polysilicon, or RPO (resist protective oxide). The first and second contacts 214 and 216 may be made of a material selected from the group consisting of tungsten, aluminum, copper, and a combination thereof.

Figure 3A:
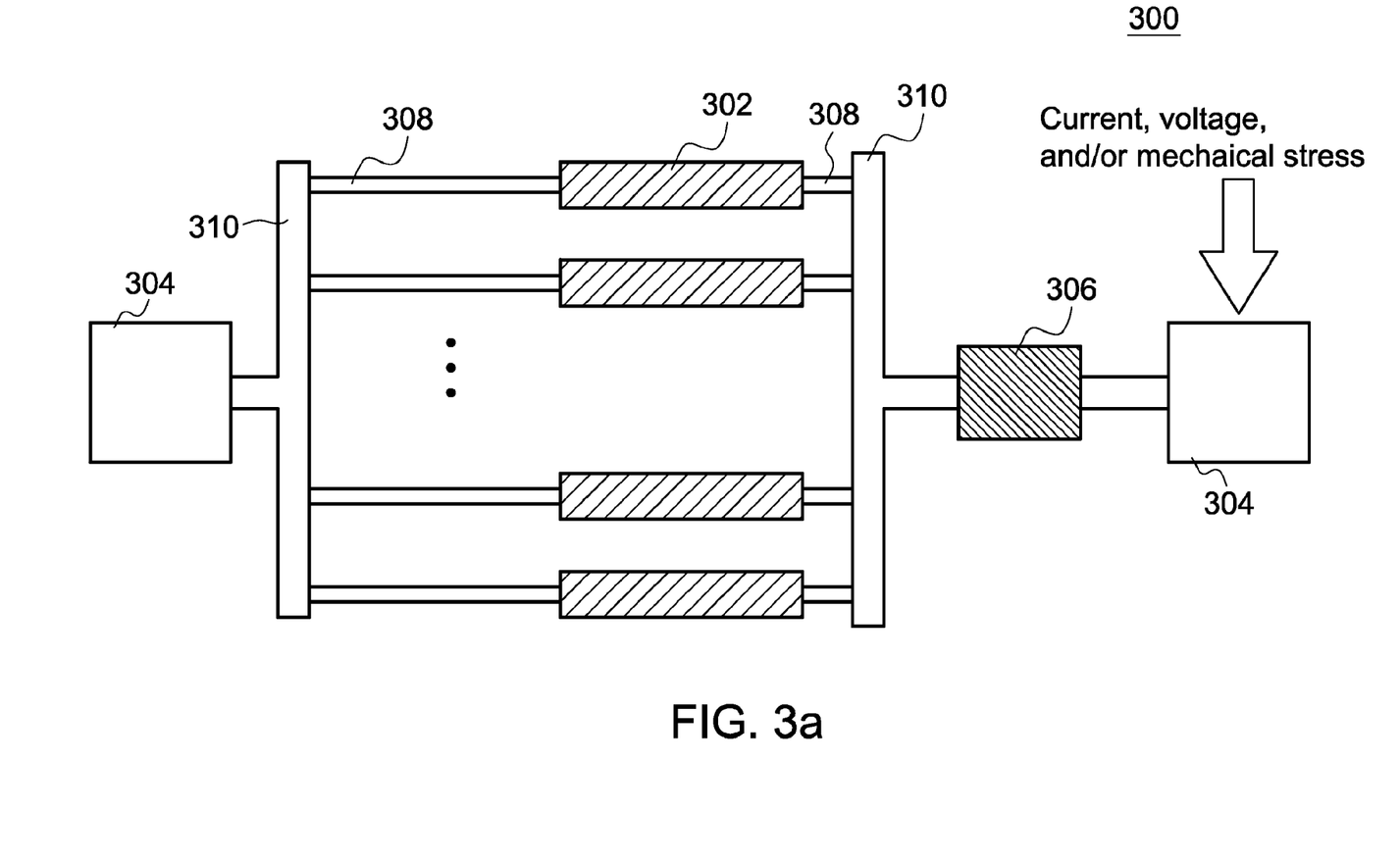
FIG. 3a illustrates a third embodiment of the interconnection test structure according to the present invention.

Referring to FIG. 3a, a third embodiment of the interconnection test structure 300 according to the present invention is illustrated. The interconnection test structure 300 includes a plurality of interconnection test patterns 302, a pad 304 and at least one resistor 306 between at least one of the plurality of interconnection test patterns 302 and the pad 304. The plurality of interconnection test patterns 302 are parallelly connected to the pad 304. The property of the plurality of interconnection test patterns 302 is measured by applying a current, a voltage and/or a mechanical stress to the pad 304.

The interconnection test structure 300 is similar to the interconnection test structure 100 shown in FIG. 1a, except that the resistor 306 is located among the second metal line 310 of a second width, while the second width is still at least three times larger than the first width of the first metal line 308 included in the plurality of interconnection test patterns 302. Although the resistor 306 is shown between only one pad 304 and the interconnection test patterns 302 in FIG. 3a, it may also be present between the other pad 304 and the interconnection test patterns 302. The first metal line 308 and the second metal line 310 may be made of a material selected from the group consisting of tungsten, aluminum, copper, and a combination thereof.

Figure 3B:
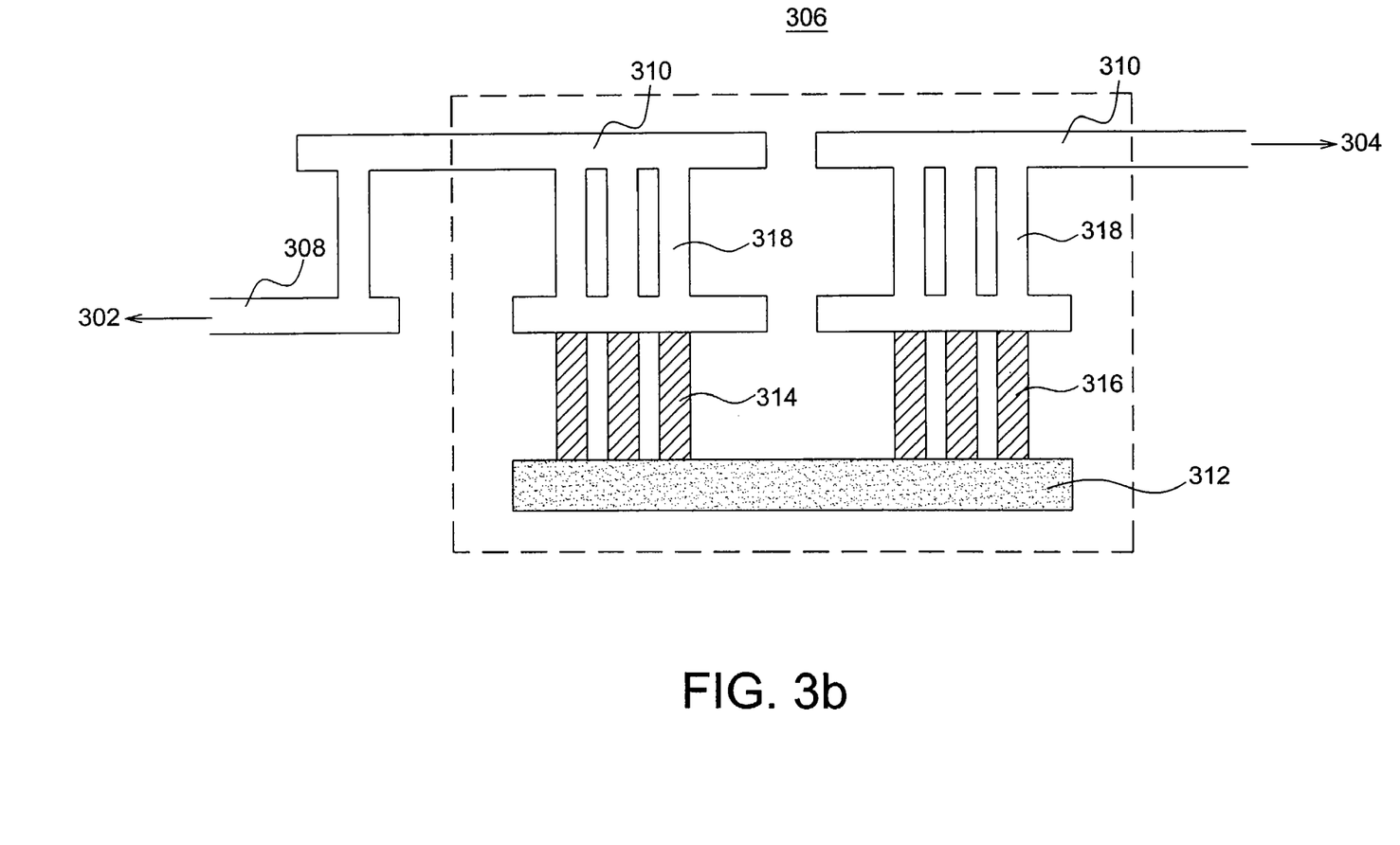
FIG. 3b is a cross-sectional view of one exemplary structure of the resistor in the third embodiment.

One exemplary structure of the resistor 306 in the third embodiment is shown in FIG. 3b. The resistor 306 may include a resistive area 312, a first contact 314 and a second contact 316. The first contact 314 connects the at least one of the plurality of interconnection test patterns 302 to the resistive area 312 through the via 318, the second metal line 310 and the first metal line 308. The second contact 316 connects the pad 304 to the resistive area 312 through the via 318 and the second metal line 310. The resistive area 312 may include a polysilicon-based material, such as polysilicon or doped polysilicon, or RPO (resist protective oxide). The first and second contacts 314 and 316 may be made of a material selected from the group consisting of tungsten, aluminum, copper, and a combination thereof.

Figure 3C:
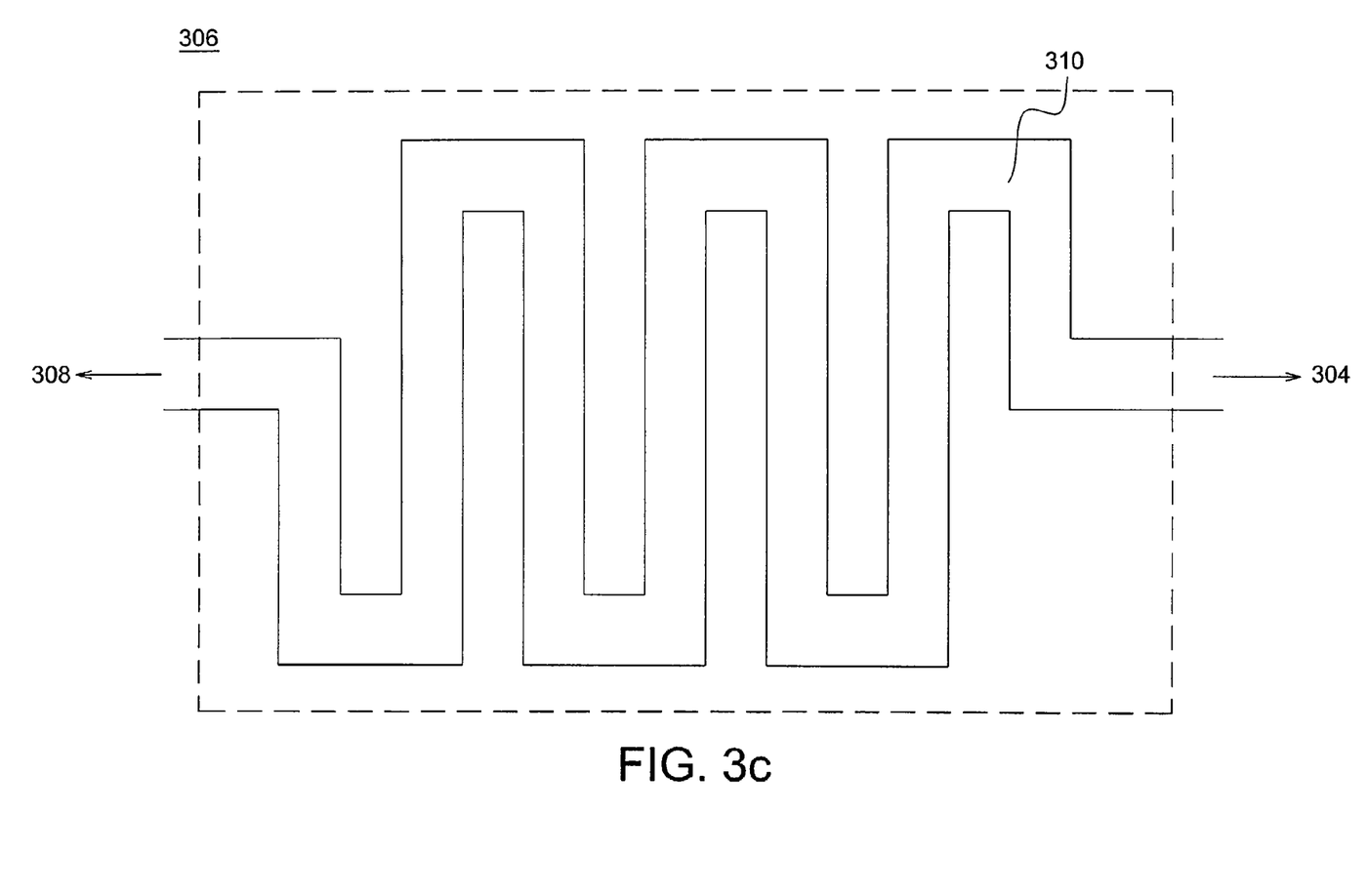
FIG. 3c is a top view of another exemplary structure of the resistor in the third embodiment.

FIG. 3c is a top view of another exemplary structure of the resistor 306 in the third embodiment. The resistor 306 may be formed by winding the second metal line 308, which connected to the at least one of the plurality of interconnection test patterns 302 through the first metal line 308 at one end and connected to the pad 304 at the other end.

Figure 4A:
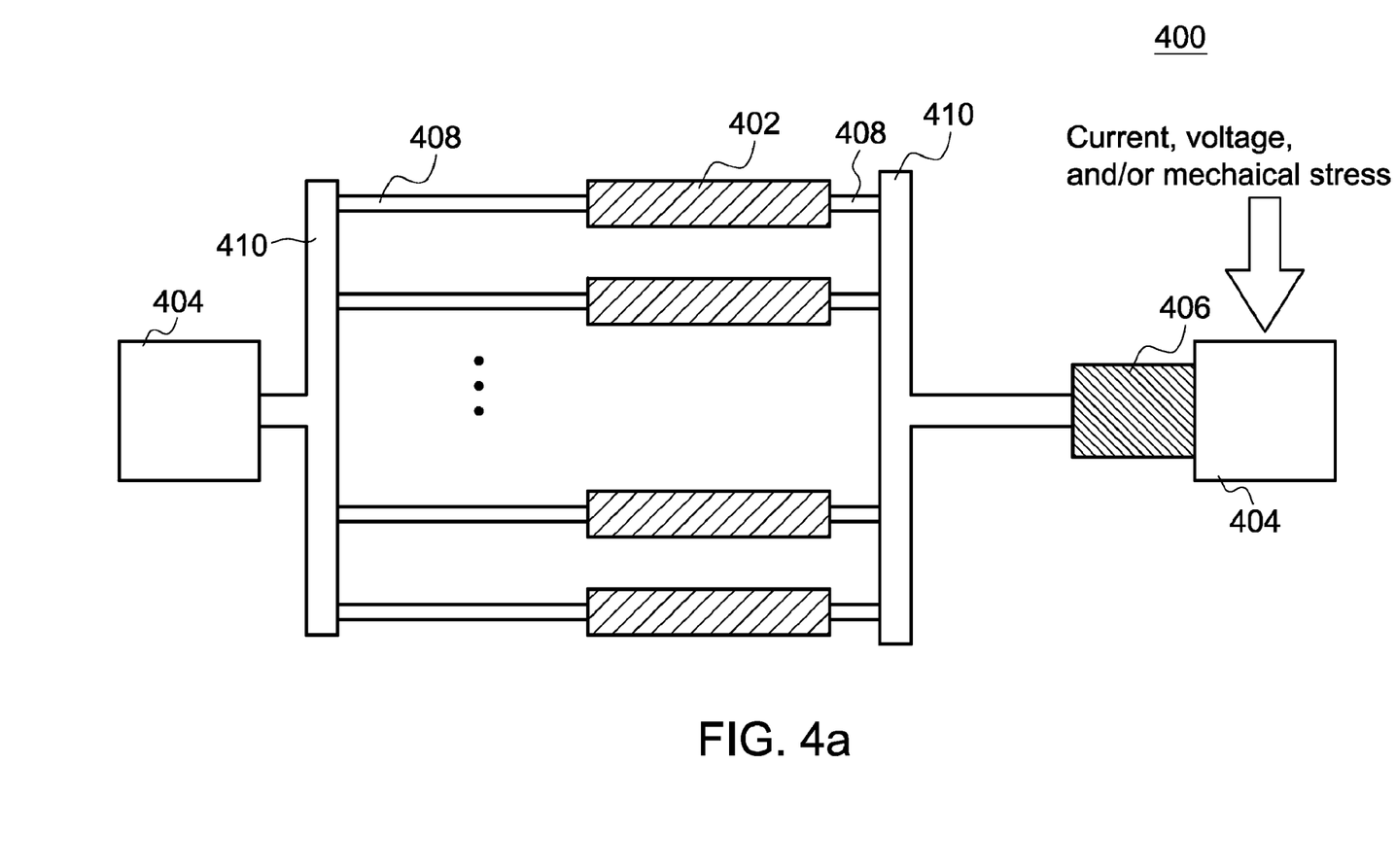
FIG. 4a illustrates a fourth embodiment of the interconnection test structure according to the present invention.

Referring to FIG. 4a, a fourth embodiment of the interconnection test structure 400 according to the present invention is illustrated. The interconnection test structure 400 includes a plurality of interconnection test patterns 402, a pad 404 and at least one resistor 406 between at least one of the plurality of interconnection test patterns 402 and the pad 404. The plurality of interconnection test patterns 402 are parallelly connected to the pad 404. The property of the plurality of interconnection test patterns 402 is measured by applying a current, a voltage and/or a mechanical stress to the pad 404.

The interconnection test structure 400 is similar to the interconnection test structure 100 shown in FIG. 1a, except that the resistor 406 is located between the second metal line 410 of a second width and the pad 404. The second width is still at least three times larger than the first width of the first metal line 408 included in the plurality of interconnection test patterns 402. Although the resistor 406 is shown between only one pad 404 and the interconnection test patterns 402 in FIG. 4a, it may also present between the other pad 404 and the interconnection test patterns 402. The first metal line 408 and the second metal line 410 may be made of a material selected from the group consisting of tungsten, aluminum, copper, and a combination thereof.

Figure 4B:
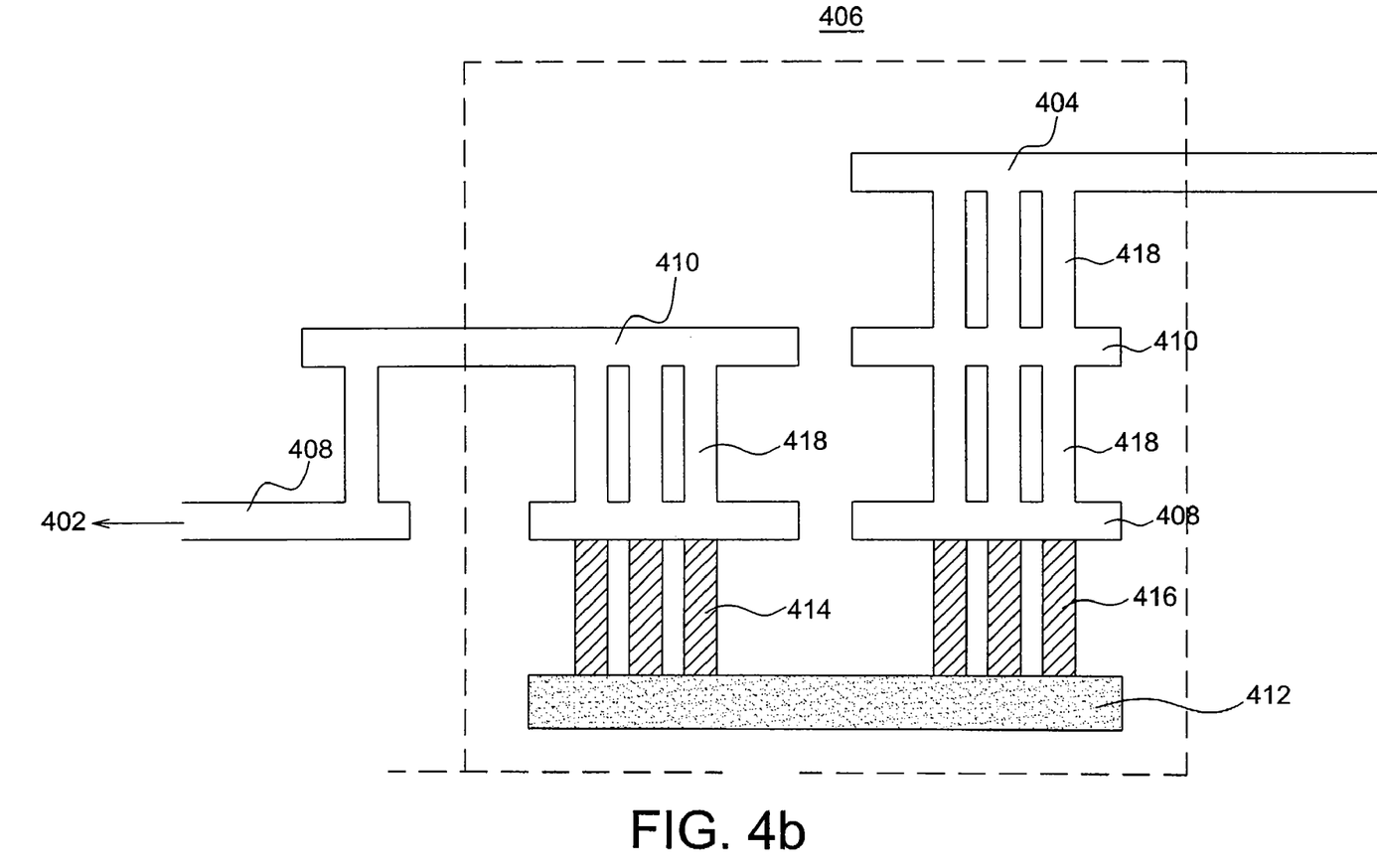
FIG. 4b is a cross-sectional view of one exemplary structure of the resistor in the fourth embodiment.

One exemplary structure of the resistor 406 in the fourth embodiment is shown in FIG. 4b. The resistor 406 may include a resistive area 412, a first contact 414 and a second contact 416. The first contact 414 connects the at least one of the plurality of interconnection test patterns 402 to the resistive area 412 through the first metal line 408, the second metal line 410 and the via 418. The second contact 416 connects the pad 404 to the resistive area 412 through the via 418, the second metal line 410 and the first metal line 408. The resistive area 412 may include a polysilicon-based material, such as polysilicon or doped polysilicon, or RPO (resist protective oxide). The first and second contacts 414 and 416 may be made of a material selected from the group consisting of tungsten, aluminum, copper, and a combination thereof.

Figure 5A:
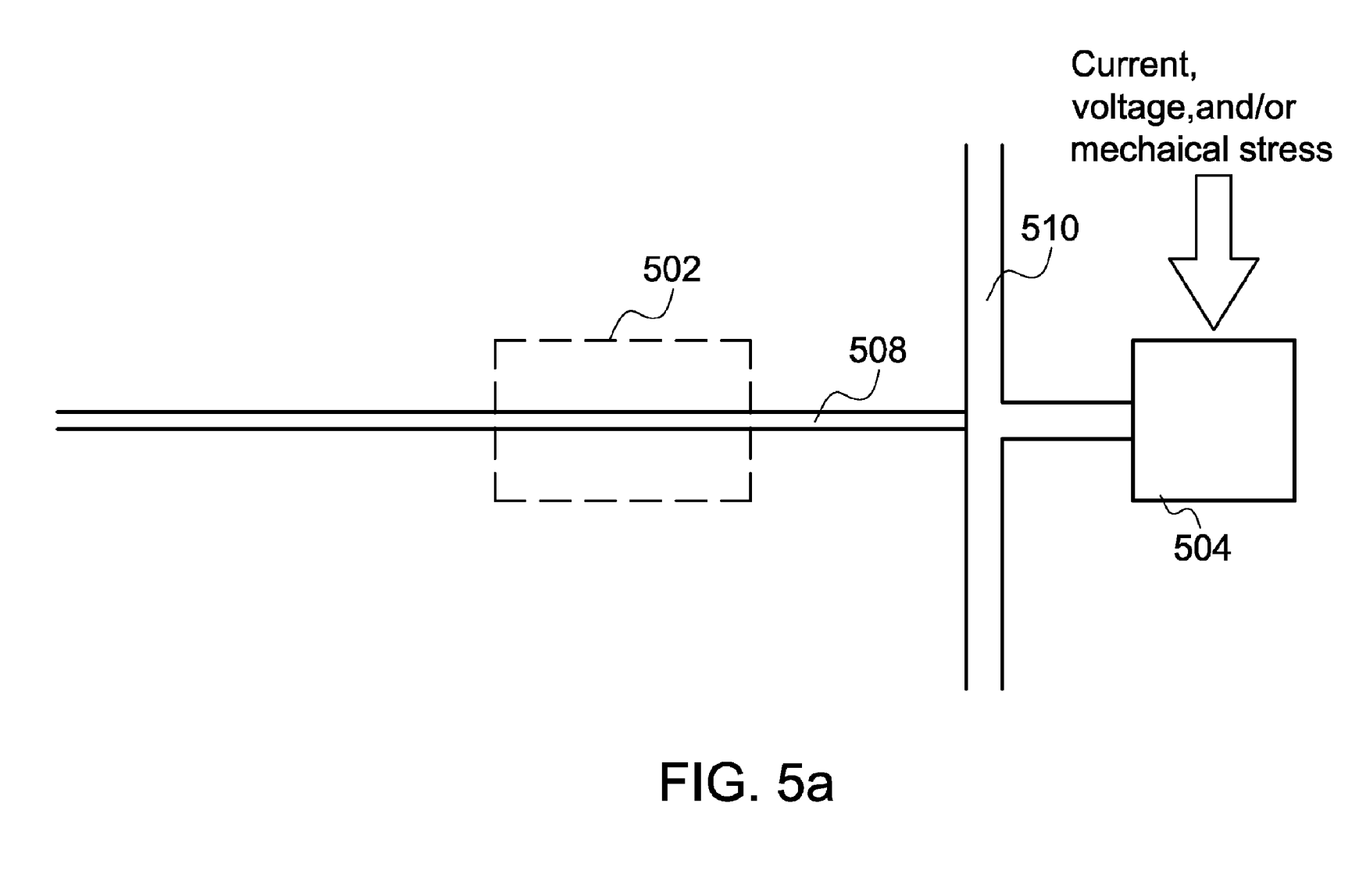
FIG. 5a illustrates a top view of one exemplary interconnection test pattern in the present invention.
Figure 5B:
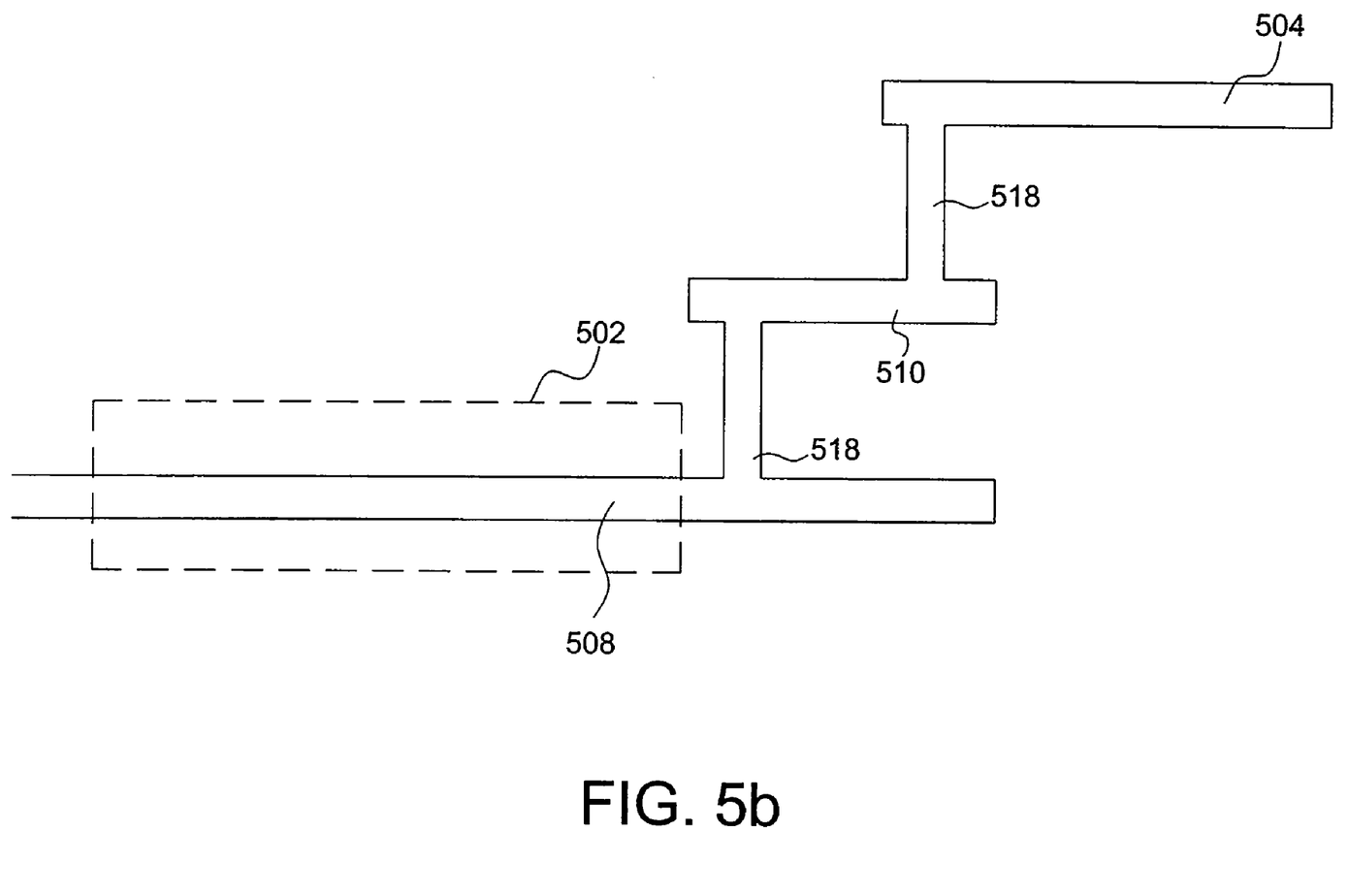
FIG. 5b illustrates a cross-sectional view of the exemplary interconnection test pattern in the present invention.

Referring to FIGS. 5a and 5b, the top view and cross-sectional view of one exemplary interconnection test pattern 502 in the present invention are illustrated. The interconnection test pattern 502 may be a simple straight line including the first metal line 508, as shown in FIG. 5a, or any other patterns on demand. The interconnection test pattern 502 shown in FIG. 5a may be consisted of the first metal line 508, and connected to the pad 504 through the via 518 and the second metal line 510.

The above description is only for preferred embodiments, but not to limit the scope of the present invention. Any other equivalent changes or modifications performed with the spirit disclosed by the present invention should be included in the appended claims.

We claim:

1. A method for measuring a property of interconnections, comprising:
   providing a plurality of interconnection test patterns; forming a plurality of pads wherein said plurality of interconnection test patterns are parallelly connected to said pads;
   forming at least one resistor between at least one of said plurality of interconnection test patterns and at least one of said pads; and
   measuring said property of said plurality of interconnection test patterns by applying a current, a voltage and/or a mechanical stress to said pads.

2. The method according to claim 1, wherein said step of providing a plurality of interconnection test patterns comprises providing a first metal line of a first width, said plurality of interconnection test patterns is connected to said pad through a second metal line of a second width, and said second width is at least three times larger than said first width.

3. The method according to claim 2, wherein said step of forming at least one resistor comprises forming at least one resistor between said first metal line and said second metal line.

4. The method according to claim 2, wherein said step of forming at least one resistor comprises forming at least one resistor between said second metal line and said pad.

5. The method according to claim 1, wherein said step of forming at least one resistor comprises:
   forming a resistive area; forming a first contact connecting said at least one of said plurality of interconnection test patterns to said resistive area; and
   forming a second contact connecting said pad to said resistive area.

6. The method according to claim 5, wherein said step of forming a resistive area comprises forming a polysilicon-based area.

7. The method according to claim 1, wherein said step of forming at least one resistor comprises:
   forming a winding metal line connected to said at least one of said plurality of interconnection test patterns at one end and connected to said pad at the other end.

8. The method according to claim 1, wherein said step of measuring said property comprises measuring electromigration, stress migration, or a combination thereof.

9. The method according to claim 1, wherein said step of measuring said property comprises detecting a resistance variation of said plurality of interconnection test patterns.

10. The method according to claim 1, wherein said step of forming at least one resistor comprises forming at least one resistor of a resistance between 100-5000 Ω.

11. An interconnection test structure for measuring a property of interconnections, comprising:
 a plurality of interconnection test patterns;
 a plurality pads wherein said plurality of interconnection test patterns are parallelly connected to said pads; and
 at least one resistor between at least one of said plurality of interconnection test patterns and at least one of said pads; wherein said property of said plurality of interconnection test patterns is measured by applying a current, a voltage, a mechanical stress, or a combination thereof to said pads.

12. The interconnection test structure according to claim 11, wherein said plurality of interconnection test patterns comprise a first metal line of a first width, said plurality of interconnection test patterns are connected to said pad through a second metal line of a second width, and said second width is at least three times larger than said first width.

13. The interconnection test structure according to claim 12, wherein said at least one resistor is located between said first metal line and said second metal line.

14. The interconnection test structure according to claim 12, wherein said at least one resistor is located between said second metal line and said pad.

15. The interconnection test structure according to claim 11, wherein said at least one resistor comprises:
 a resistive area;
 a first contact connecting said at least one of said plurality of interconnection test patterns to said resistive area; and
 a second contact connecting said pad to said resistive area.

16. The interconnection test structure according to claim 15, wherein said resistive area comprises a polysilicon-based material.

17. The interconnection test structure according to claim 11, wherein said at least one resistor comprises:
 a winding metal line connected to said at least one of said plurality of interconnection test patterns at one end and connected to said pad at the other end.

18. The interconnection test structure according to claim 11, wherein said property comprises electromigration, stress migration, or a combination thereof.

19. The interconnection test structure according to claim 11, wherein said property is measured further by detecting a resistance variation of said plurality of interconnection test patterns.

20. The interconnection test structure according to claim 11, wherein said at least one resistor has a resistance between 100-5000 Ω.

* * * * *